(12) United States Patent
Choi et al.

(10) Patent No.: US 7,744,946 B2
(45) Date of Patent: Jun. 29, 2010

(54) ORGANIC SILOXANE RESINS AND INSULATING FILM USING THE SAME

(75) Inventors: Bum-gyu Choi, Daejeon (KR); Min-jin Ko, Daejeon (KR); Byung-ro Ko, Daejeon (KR); Myung-sun Moon, Daejeon (KR); Jung-won Kang, Seoul (KR); Hye-yeong Nam, Daejeon (KR); Gwi-gwon Kang, Seoul (KR)

(73) Assignee: LG Chem, Ltd., Seoul (KR)

( * ) Notice: Subject to any disclaimer, the term of this patent is extended or adjusted under 35 U.S.C. 154(b) by 618 days.

(21) Appl. No.: 10/541,844

(22) PCT Filed: Apr. 16, 2004

(86) PCT No.: PCT/KR2004/000877

§ 371 (c)(1),
(2), (4) Date: Jan. 6, 2006

(87) PCT Pub. No.: WO2004/092252

PCT Pub. Date: Oct. 28, 2004

(65) Prior Publication Data

US 2006/0141163 A1 Jun. 29, 2006

(30) Foreign Application Priority Data

Apr. 17, 2003 (KR) ...................... 10-2003-0024406

(51) Int. Cl.
*B05D 5/12* (2006.01)
(52) U.S. Cl. ........................ 427/58; 427/96.1; 427/96.2; 427/96.5; 427/385.5; 427/387
(58) Field of Classification Search ................... 427/58, 427/96.1, 96.2, 387
See application file for complete search history.

(56) References Cited

U.S. PATENT DOCUMENTS

| 3,615,272 | A | * | 10/1971 | Collins et al. ................ 423/325 |
| 5,116,637 | A | * | 5/1992 | Baney et al. ................. 427/340 |
| 5,262,201 | A | * | 11/1993 | Chandra et al. ........... 427/376.2 |
| 5,855,962 | A | * | 1/1999 | Cote et al. ................ 427/376.2 |
| 5,906,859 | A | * | 5/1999 | Bremmer et al. ............. 427/226 |
| 6,399,210 | B1 | * | 6/2002 | Zhong ........................ 428/447 |
| 6,410,141 | B1 | | 6/2002 | Grimmer |
| 6,790,533 | B2 | * | 9/2004 | Reitmeier et al. ........... 428/447 |
| 6,824,833 | B2 | * | 11/2004 | Nishikawa et al. .......... 427/387 |
| 7,057,002 | B2 | * | 6/2006 | Lee et al. ....................... 528/35 |
| 2001/0055892 | A1 | | 12/2001 | Nishikawa et al. |
| 2002/0106500 | A1 | * | 8/2002 | Albano et al. ............ 428/304.4 |

FOREIGN PATENT DOCUMENTS

| JP | 2001-206710 | 7/2001 |
| KR | 1020020097415 | 12/2002 |
| KR | 1020030000709 | 1/2003 |

OTHER PUBLICATIONS

Translation of KR 20020097415, Dec. 2002.*
Translation of KR 20030000709, Jan. 2003.*

* cited by examiner

*Primary Examiner*—Erma Cameron
(74) *Attorney, Agent, or Firm*—McKenna Long & Aldridge LLP

(57) ABSTRACT

The present invention relates to organic siloxane resins and insulating films using the same. The insulating films are manufactured by using organic siloxane resins, wherein organic siloxane resins are hydrolysis-condensation polymers of silane compounds comprising one or more kinds of hydrosilane compounds. They have superior mechanical properties and a low electric property, and therefore, are properly usable for highly integrated semiconductor devices.

6 Claims, No Drawings

ORGANIC SILOXANE RESINS AND INSULATING FILM USING THE SAME

This application claims priority to PCT/KR2004/000877, filed on Apr. 16, 2004, and Korean Application No. 10-2003-0024406, filed Apr. 17, 2003 in Korea, which is hereby incorporated by reference in its entirety.

TECHNICAL FIELD

The present invention relates to organic siloxane resins and insulating films using the same. In more detail, the present invention relates to organic siloxane resins having superior mechanical properties and a low dielectric property and insulating films for semiconductor elements using the same.

BACKGROUND ART

Recently, the line width used for manufacturing semiconductor devices has been reduced rapidly as the degree of integration of semiconductor devices has been increased. Generally, the speed of semiconductor devices is proportional to the switching speed of gates and the signal transmission speed. The latter is determined according to the RC delay indicated in terms of the multiplication of resistance of wiring materials and electrostatic capacity of interlayer insulating films. As the design rules of semiconductor devices are reduced, the speed of a high-density chip is determined according to the RC delay rather than the speed of gates. Therefore, in order to manufacture high-speed chips, conductors having a low resistance and insulating materials having a low dielectric constant should be used. For this reason, the conventional aluminum wiring is replaced with copper wiring, and the development of insulating films with a low dielectric constant is in progress. The use of the low dielectric materials increases the speed of semiconductor devices and decreases the power dissipation and crosstalk noise.

In the meantime, a general example of interlayer insulating materials of semiconductor devices is $SiO_2$ manufactured in the gaseous vapor deposition method having a dielectric constant of 4.0, and silicate doped with fluorine ($F$—$SiO_2$) is applied for some devices as a low dielectric material. However, in case of $F$—$SiO_2$, it may be difficult to lower the dielectric constant to 3.5 or less since the state may thermally become unstable as the content of fluorine is increased.

Recently, many organic and inorganic polymers having a low polarity and a high thermal stability have been presented to solve this problem. Organic polymers having a low dielectric constant are known to include polyimide resins containing or not containing fluorine, polyarylene ether resins, polyaromatic hydrocarbon resins, etc. Most of these organic polymers have a dielectric constant of 3.0 or less. However, they have a very high linear expansion coefficient, and also have a low glass transition temperature and thus elasticity thereof remarkably decreases at a high temperature. The resulting low thermal stability can deteriorate the reliability of devices. Recently, in order to solve thermal stability problems of organic polymers, the development of organic silicate polymers using a sol-gel process has emerged. Organic silicate films are obtained by hydrolyzing and condensing organic silanes, and curing them. Polysilsesquioxane has a comparatively low dielectric constant of less than 3.0 and is stable at 450° C. However, the dielectric films prepared with polysilsesquioxane may crack at >1 μm due to contraction stress during a hardening process, and the dielectric constant of the films is in the range of 2.7 to 3.1. Therefore, it is not sufficient for the material having a good mechanical property and a dielectric, 2.5 or less which is necessary for the semiconductor process in the future.

In order to form insulating films having a dielectric constant of 2.5 or less, it has been proposed a method of adding an organic polymer template to polysilsesquioxane and forming low-density insulating films having nano-pores through pyrolysis after hardening. However, this method is problematic in that the strength of low-density insulating films is not sufficient; it is likely for organic materials not to be decomposed completely but to remain; the sizes of pores are increased if the compatibility between organic polymers and polysilsesquioxanes is lowered; etc. In addition, porous low dielectric films have been prepared by using an organic polysiloxane manufactured through hydrolysis and condensation of general alkoxy silanes under a basic condition. However it is difficult to obtain siloxane polymers having sufficient mechanical properties.

While studying organic polysiloxane resins and compositions in order to manufacture insulating films having a low dielectric constant and superior mechanical properties, the inventors of the present invention have found that organic polysiloxane resins manufactured through hydrolysis and condensation of a specific silane compound under a basic condition have more superior mechanical properties compared to porous low dielectric films manufactured by using organic polysiloxane resins manufactured through hydrolysis and condensation of only a general silane compound under a basic condition or organic polysiloxane resins and organic polymers manufactured through hydrolysis and condensation under an acidic condition, and completed the present invention based on the above.

DISCLOSURE OF INVENTION

The present invention is made in consideration of the problems of the prior art, and it is an object of the present invention to provide organic siloxane resins having superior mechanical properties and a low dielectric property that can be used for highly integrated semiconductor devices.

It is another object of the present invention to provide a composition comprising the above siloxane polymer for forming insulating films.

It is another object of the present invention to provide a process for preparing insulating films using the above composition.

It is another object of the present invention to provide insulating films for a semiconductor device manufactured by the above process.

It is still another object of the present invention to provide an electronic device comprising the above insulating films.

All of the above-described objects and other objects of the present invention may be achieved by the present invention illustrated below:

In order to achieve the above-described objects, the present invention provides organic siloxane resins that are condensed polymers manufactured through the reaction of silane compounds including one or more kinds of hydrosilane compounds under a basic condition.

The above-described silane compounds may be hydrosilane compounds, or may be composed of hydrosilane compounds and organic silane compounds other than the hydrosilane compounds.

The above-described hydrosilane compounds may be silane compounds having the following Chemical Formula 1, oligomers manufactured from the compounds having the Chemical Formula 1, or cyclic siloxane compounds having the following Chemical Formula 2:

$$H_nSiR^1{}_{4-n}$$ [Chemical Formula 1]

where $R^1$ is independently fluorine, aryl, vinyl, allyl, or linear or branched C1~4 alkyl substituted or unsubstituted with fluorine, or alkoxy; and n is an integer of 1 to 3.

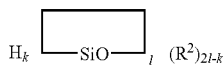

[Chemical Formula 2]

where $R^2$ is independently fluorine, aryl, vinyl, allyl, or linear or branched C1~4 alkyl substituted or unsubstituted with fluorine, or alkoxy; and k and l are integers of 3 to 10.

Silane compounds other than the above-described hydrosilane compounds may be organic siloxane resins characterized by being the silane compounds having the following Chemical Formula 3 or 4:

$$SiR^3{}_pR^4{}_{4-p}$$ [Chemical Formula 3]

where $R^3$ is independently fluorine, aryl, vinyl, allyl, or linear or branched C1~4 alkyl substituted or unsubstituted with fluorine; $R^4$ may be the same or different, and is acetoxy, hydroxy, or linear or branched C1~4 alkoxy; and p is an integer of 0 to 3.

$$R^5{}_qR^6{}_{3-q}Si\text{-}M\text{-}SiR^7{}_rR^8{}_{3-r}$$ [Chemical Formula 4]

where $R^5$ and $R^7$ are independently fluorine, aryl, vinyl, ally, or linear or branched C1~4 alkyl substituted or unsubstituted with fluorine; $R^6$ and $R^8$ are independently acetoxy, hydroxy, or linear or branched C1~4 alkoxy; M is alkylene or phenylene having 1 to 6 carbon atoms; and q and r are integers of 0 to 3.

The present invention also provides a composition comprising the organic siloxane resins for forming insulating films.

The present invention also provides with a process for preparing an insulating film comprising the steps of preparing an organic siloxane resin; dissolving the organic siloxane resin in an organic solvent; forming an insulating film by coating a solution, which is prepared by dissolving the above organic siloxane resin in organic solvent; and drying and hardening the insulating film formed in the above.

The above process of forming insulating films may further include a step of adding one or more kinds of additives selected from the group consisting of organic molecules, organic polymers, organic dendrimers, water, pH controlling agents, colloidal silica, and surfactants.

The present invention also provides insulating films manufactured by the above process.

Further, the present invention provides electronic devices comprising the above insulation film.

Hereinafter, the present invention is illustrated in more detail as follows:

The present invention is characterized by providing organic siloxane resins that can be used for insulating films having superior mechanical and dielectric properties for highly integrated semiconductor devices.

Organic siloxane resins of the present invention are condensed polymers of silane compounds comprising one or more kinds of specific hydrosilane compounds. They are manufactured through the hydrolysis and condensation reaction of silane compounds comprising one or more kinds of hydrosilane compounds in an organic solvent under a basic catalyst, where the hydrolysis and condensation may be done only with hydrosilane compounds, or with hydrosilane compounds and organic silane compounds other than the hydrosilane compounds. The reason for the improvement of mechanical strength is not known yet precisely, but hydrosilane compounds become hydroxy silanes (Si—OH) due to the dehydrogenation reaction of hydrogens bonded to silicon (Si—H) under a base catalyst and water. It seems that this reaction is greatly faster than the formation of hydroxy functional radicals by the hydrolysis reaction of general alkoxy silanes under a base catalyst and water; the initial concentration of hydroxy silanes becomes different; and the organic siloxane resins generated through the subsequent condensation reaction also have a different structure from those of organic siloxane resins manufactured by using general alkoxy silanes.

Hydrosilane compounds used in the present invention are silane compounds in which one or more hydrogens are bonded chemically to silicon. The concentration and various structures of hydroxy silanes can be controlled due to the dehydrogenation reaction of the hydrogens bonded to silicon under a base catalyst. The hydrosilane compounds used in the present invention are not specifically limited to silane compounds in which one or more hydrogens are bonded chemically to silicon, but preferably those represented by the following Chemical Formula 1, oligomers thereof, or cyclic siloxane compounds represented by the following Chemical Formula 2:

$$H_nSiR^1{}_{4-n}$$ [Chemical Formula 1]

where $R^1$ is independently fluorine, aryl, vinyl, allyl, or linear or branched C1~4 alkyl substituted or unsubstituted with fluorine, or alkoxy; and n is an integer of 1 to 3.

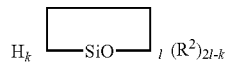

[Chemical Formula 2]

where $R^2$ is independently fluorine, aryl, vinyl, allyl, or linear or branched C1~4 alkyl substituted or unsubstituted with fluorine or alkoxy; and k and l are integers of 3 to 10.

Organic silane compounds other than the hydrosilane compounds usable in the present invention are not specifically limited, but preferably those represented by the following Chemical Formula 3 or 4:

$$SiR^3{}_pR^4{}_{4-p}$$ [Chemical Formula 3]

where $R^3$ is independently fluorine, aryl, vinyl, allyl, or linear or branched C1~4 alkyl substituted or unsubstituted with fluorine; $R^4$ is independently acetoxy, hydroxy, or linear or branched C1~4 alkoxy; and p is an integer of 0 to 3.

$$R^5{}_qR^6{}_{3-q}Si\text{-}M\text{-}SiR^7{}_rR^8{}_{3-r}$$ [Chemical Formula 4]

where $R^5$ and $R^7$ are independently fluorine, aryl, vinyl, ally, or linear or branched C1~4 alkyl substituted or unsubstituted with fluorine; $R^6$ and $R^8$ are independently acetoxy, hydroxy, or linear or branched C1~4 alkoxy; M is alkylene or phenylene having 1 to 6 carbon atoms; and q and r are integers of 0 to 3.

In preparing organic siloxane in the present invention, the mixing order of the silane compounds of the above Chemical Formula 1, Chemical Formula 2, Chemical Formula 3, and Chemical Formula 4 is not specifically limited, and the total amount may be mixed from the beginning, and hydrolysis-condensation reaction conducted, or a specific amount may be first reacted to a specific molecular weight and the remaining amount may be added and further reacted. Moreover, they may be used in combination with other organic siloxane resins.

The organic solvent used in the present invention is not specially limited, if the silane compound, water, and catalyst are appropriately mixed, and if significant difficulty in phase separation is not caused in the hydrolysis and condensation reaction. However, it is proper to use aliphatic-hydrocarbon-group solvents such as n-pentane, i-pentane, n-hexane, i-hexane, 2,2,4-trimethylpentane, cyclohexane, methylcyclohexane, etc.; aromatic-hydrocarbon-group solvents such as benzene, toluene, xylene, trimethylbenzene, ethylbenzene, methyl ethyl benzene, etc.; alcohol-group solvents such as methyl alcohol, ethyl alcohol, n-propanol, i-propanol, n-butanol, i-butanol, sec-butanol, t-butanol, 4-methyl-2-pentanol, cyclohexanol, methylcyclohexanol, glycerol; ketone-group solvents such as methyl ethyl ketone, methyl isobutyl ketone, diethyl ketone, methyl n-propl ketone, methyl n-butyl ketone, cyclohexanone, methylcyclohexanone, acetylacetone, etc.; ether-group solvents such as tetrahydrofuran, 2-methyltetrahydrofuran, ethyl ether, n-propyl ether, isopropyl ether, diglyme, dioxane, dimethyldioxane, ethylene glycol monomethyl ether, ethylene glycol dimethyl ether, ethylene glycol diethyl ether, propylene glycol monomethyl ether, propylene glycol dimethyl ether, etc.; ester-group solvents such as diethyl carbonate, methyl acetate, ethyl acetate, ethyl lactate, ethylene glycol monomethyl ether acetate, propylene glycol monomethyl ether acetate, ethylene glycol diacetate, etc.; and amide-group solvents such as N-methylpyrrolidone, formamide, N-methyl formamide, N-ethyl formamide, N,N-dimethyl acetamide, N,N-dimethyl acetamide, etc. Particularly preferable are alcohol-group solvents as they facilitate controlling of the reaction speed.

The present invention uses a catalyst in order to promote hydrolysis and condensation. The catalyst used in hydrolysis and condensation is either an acid catalyst or a base catalyst. However, it is desirable to use a base catalyst. in order to manufacture low dielectric organic siloxane resins applicable to insulating films for semiconductor devices For examples, the base basic catalysts include alkali metallic compounds, ammonia, organic amines, quaternary ammonium compounds, etc. The added amount of the catalyst can be controlled according to the reaction condition, and preferably 10 moles or less per 1 mole of the silane compound. If the added amount of the catalyst exceeds 10 moles per 1 mole of silane compound, the reaction rate is very high even at a low concentration and it will be difficult to control the molecular weight and gel may be easily produced. Also, a catalyst maybe previously added to the organic solvent or it may be previously dissolved or dispersed in water.

In the present invention, water is added to cause hydrolysis of the silane compound. The amount of water is suitably 2 or more per 1 mole of the silicon atom in the silane compound, more preferably, 5 moles or more. If less than 2 moles of water is added, the hydrolysis and condensation does not sufficiently occur; it is difficult to control the molecular weight since the reaction rate is very high; and it is not proper to apply them to the insulting films of semiconductor devices. Water may be added intermittently or consecutively.

There are no limitations on the reaction temperature when the product is made to have a desired molecular weight. The temperature may preferably be 0 to 100° C., more preferably 0 to 80° C.

In the present invention, it is usually preferred to set the molecular weight of the final product, 5000 or greater compared to the conversion molecular weight of polystyrene; 10,000 or greater preferably; or 30,000 or greater more preferably.

The present invention also provides a composition for forming insulating films by using the organic siloxane resins as described in the above. The above-described composition comprises organic siloxane resins and a solvent, and it can further comprises, one or more kinds of additives selected from the group consisting of organic molecules, organic polymers, organic dendrimers, water, pH controlling agents, colloidal silica, and surfactants according to its purpose.

Furthermore, the method of forming insulating films using the organic siloxane resins of the present invention is comprised of the steps of preparing an organic siloxane resins as described in the above; dissolving the organic siloxane resins in an organic solvent; forming an insulating film by coating a solution, which is prepared by dissolving the above organic siloxane resin in organic solvent; and drying and hardening the insulating film formed in the above.

And the above-described method of forming insulating films may further comprise a step of adding one or more kinds of additives selected from the group consisting of organic molecules, organic polymers, organic dendrimers, water, pH controlling agents, colloidal silica, and surfactants, after the step of dissolving the organic siloxane resins in an organic solvent.

In the method of forming the composition, organic materials such as organic molecules, organic polymers, organic dendrimers, etc., among the additives, are added when desiring to further lower the density of insulating films. The organic materials are not specially limited, but preferably decomposed at a temperature in the range of 200 to 450° C. Preferable examples include organic molecules or organic polymers including aliphatic hydrocarbons, aromatic hydrocarbons, ether functional-group molecules, ester functional-group molecules, anhydride functional-group molecules, carbonate functional-group molecules, acryl functional-group molecules, thioether functional-group molecules, isocyanate functional-group molecules, isocyanulate functional-group molecules, sulfon functional-group molecules, sulfoxide functional-group molecules, etc. Also, the organic molecules or organic polymers may contain alkoxy silane functional radicals at the end of or in the molecule, which may be reacted with the organic siloxane resins.

The solid concentration can be controlled by the type and content of organic solvents. The composition of the present invention comprises 2 to 60% of total solid concentration, and preferably 5 to 40%, considering the film thickness and maintenance stability of insulating films.

In the method of forming a composition of the present invention, organic solvents may be removed a fixed amount of specific solvents having negative affects on the coating property, water, and by-products of reaction. Also, it is possible to add a fixed amount of a secondary organic solvent after the hydrolysis and condensation reaction, or to remove specific organic solvents, water, and by-products of reaction after adding the secondary organic solvent according to its purpose. Moreover, it is possible to mix and use one or more kinds of organic solvents.

The solution containing organic siloxane resins is coated on a substrate such as a silicone wafer, $SiO_2$ wafer, SiN water, semiconductor, glass substrate, polymer substrate, etc to form an insulating film by a spin-coating method, an impregnation method, a roll-coating method, a spraying method, etc. It is preferred to use a spin-coating method among the methods of forming insulating films for a semiconductor device.

The thickness of the film may be controlled by changing the viscosity of the composition and the rotation speed of a spin coater, and for an interlayer insulating film for a multilayered circuit for a semiconductor device, 0.05 to 2 μm is suitable.

After insulating films are formed, they go through the drying and hardening processes, where the drying process is divided into the pre-baking process and soft-baking process. The organic solvents used are evaporated slowly in the pre-baking process; specific amounts of functional group are cross-linked in the soft-baking process; and the remaining functional groups are further reacted in the hardening process. The Drying process is conducted at 30 to 350° C.; and the hardening process is conducted at 350 to 600° C., and preferably 350 to 500° C. If the hardening temperature is lower than 350° C., the strength of films is lowered since the condensed polymerization of silicate polymers does not completely occur, and the dielectric property is deteriorated due to the existence of remaining functional group. It is also preferable not to exceed 500° C. for hardening in view point of the thermal stability of insulating films and a semiconductor device.

The drying and hardening processes may be consecutively conducted while elevating the temperature at a constant rate, or they can be conducted intermittently. If conducted intermittently, drying and hardening precess are preferably conducted for 1 minute to 5 hours, respectively. Heating can be conducted using a hot plate, oven, furnace, etc., and it can be conducted under an inert gas atmosphere such as with nitrogen, argon, helium, etc.; under an oxygen atmosphere such as air, etc.; under a vacuum condition; or under an ammonia or hydrogen-containing gas atmosphere. The drying and hardening can be conducted by the same heating methods, or they can be conducted by different methods.

The insulating films obtained by the above method are suitable for use as an interlayer insulating film for semiconductor devices such as LSI, system LSI, DRAM, SDRAM, RDRAM, D-RDRAM, etc.; a protection film such as a surface coating film of a semiconductor device, etc.; an interlayer insulating film for a multi-layered wiring substrate; a protection film for liquid-crystal-display device; a low-refraction coated film; etc. since they have a low dielectric property, low refractivity, and superior mechanical properties.

BEST MODE FOR CARRYING OUT THE INVENTION

Hereinafter, the present invention will be described more specifically by the following Examples and Comparative Examples, but the present invention is not limited to or by them/.

Preferred Embodiment 1

To a mixed solution of 34.70 g of distilled water and 221.90 g of ethanol, 1.95 g of methydimethoxy silane and 3.02 g of triethoxy silane are added, 1.00 g of 40% methylamine aqueous solution is added further as a catalyst, and reacted at 60° C. for 2 hours. After the mixture is reacted, 40.00 g of propylene glycol propyl ether is added, and the mixture is enriched by removing alcohols and a fixed amount of organic solvents with a rotary evaporator. The solution is spin-coated on a silicone wafer, and hardened under a nitrogen atmosphere at a temperature of 430° C. for 1 hour in order to manufacture insulating films.

Preferred Embodiment 2

To a mixed solution of 33.70 g of distilled water and 215.70 g of ethanol, 2.34 g of methydimethoxy silane and 2.41 g of triethoxy silane are added, 0.97 g of 40% methylamine aqueous solution is added further as a catalyst, and reacted at 60° C. for 2 hours. After the mixture is reacted, 40.00 g of propylene glycol propyl ether, which is the secondary solvent, is added, and the mixture is enriched by removing alcohols and a fixed amount of organic solvents with a rotary evaporator until the total weight of the solution becomes 20.00 g. The enriched solution is spin-coated on a silicone wafer, and hardened under a nitrogen atmosphere at a temperature of 430° C. for 1 hour in order to manufacture insulating films.

COMPARATIVE EXAMPLE 1

To 10.00 g of propylene glycol propyl ether, 3.00 g of methyl trimethoxy silane and 1.34 g of tetramethoxy silane are put, 3.70 g of the 0.03 N nitric acid solution is added further, and reacted at 60° C. for 24 hours. After the mixture is reacted, 40.00 g of propylene glycol propyl ether is added, and the mixture is enriched by removing alcohols and a fixed amount of organic solvents with a rotary evaporator. The solution is spin-coated on a silicone wafer, and hardened under a nitrogen atmosphere at a temperature of 430° C. for 1 hour in order to manufacture insulating films.

COMPARATIVE EXAMPLE 2

To a mixed solution of 33.70 g of distilled water and 172.50 g of ethanol, 3.00 g of methydimethoxy silane and 3.06 g of triethoxy silane are added, 0.97 g of 40% methylamine aqueous solution is added further as a catalyst, and reacted at 60° C. for 2 hours. After the mixture is reacted, 40.00 g of propylene glycol propyl ether is added, and the mixture is enriched by removing alcohol and a fixed amount of organic solvents with a rotary evaporator. The solution is spin-coated on a silicone wafer, and hardened under a nitrogen atmosphere at a temperature of 430° C. for 1 hour in order to manufacture insulating films.

TESTING EXAMPLE 1

Evaluation of Physical Properties

The dielectric and physical properties of insulating films manufactured in the above Preferred Embodiments 1 and 2 and Comparative Examples 1 and 2 are evaluated, of which results are shown in Table 1 below:

The mechanical strength is measured by using a Tribo Indenter from Hysitron, Inc. after the insulating films are hardened under a nitrogen atmosphere at a temperature of 430° C. for 1 hour after they are spin-coated on a 2×2-inch silicone wafer, and the dielectric constant is measured at 1 MHz by using the LCR meter from HP Company after making a MIS (metal/insulator/semiconductor) elements structure on a silicone wafer.

TABLE 1

| Classification | Preferred Embodiment 1 | Preferred Embodiment 2 | Comparative Example 1 | Comparative Example 2 |
|---|---|---|---|---|
| Mechanical strength (GPa) | 6.0 | 8.0 | 7.9 | 5.1 |
| Dielectric constant | 2.24 | 2.48 | 2.80 | 2.23 |

As shown in the above Table 1, when comparing Preferred Embodiment 1 and Comparative. Example 2, the mechanical strength is superior in Preferred Embodiment 1 in spite of similar dielectric properties; and when comparing Preferred Embodiment 2 and Comparative Example 1, the dielectric property is superior in Preferred Embodiment 2 in spite of similar mechanical strengths. As reviewed in the above, it is seen that the insulating films in preferred embodiments using the organic siloxane resins manufactured by reacting silane compounds including one or more kinds of hydrosilane compounds under a base catalyst according to the present invention have superior mechanical and insulation properties.

INDUSTRIAL APPLICABILITY

In conclusion, as illustrated in the above, the present invention is a useful invention in that organic siloxane resins and insulating films manufactured by using them according to the present invention have superior mechanical and dielectric properties, and thus, are proper for highly integrated semiconductor devices.

While certain present preferred embodiments and comparative examples of the invention have been shown and described, it is to be distinctly understood that the invention is not limited thereto but may be otherwise variously embodied and practiced within the scope of the following claims:

What is claimed is:

1. Organic siloxane resins for insulation films having a dielectric constant in the range of 2.24 to 2.48 and a mechanical strength in the range of 6 to 8 GPa, which are condensed polymers, manufactured by a hydrolysis and condensation reaction of only hydrosilane compounds, wherein at least one hydrosilane compound has the following Chemical Formula 1;

$$H_nSiR^1_{4-n} \quad \text{[Chemical Formula 1]}$$

wherein $R^1$ is independently fluorine, aryl, vinyl, allyl, linear or branched alkyl having 1 to 4 carbon atoms, or alkoxy; and n is an integer of 1 to 3.

2. Compositions for forming insulating films comprising said organic siloxane resins having a dielectric constant in the range of 2.24 to 2.48 and a mechanical strength in the range of 6 to 8 GPa, manufactured according to claim 1.

3. A method of forming insulating films using organic siloxane resins comprising the steps of:
   a) preparing an organic siloxane resin according to claim 1;
   b) dissolving the organic siloxane resin in an organic solvent to prepare a solution;
   c) forming an insulating film by coating the solution; and
   d) drying and hardening the insulating film formed in the step c) to prepare insulation films having dielectric constant in the range of 2.24 to 2.48 and mechanical strength in the range of 6 to 8 GPa.

4. The method of forming a insulating film using said organic siloxane resins according to claim 3, further comprising a step, after the above step b), of adding one or more additives selected from the group consisting of organic molecules, water, pH controlling agents, colloidal silica, and surfactants to said solution.

5. Insulation films using organic siloxane resins manufactured by drying and hardening insulating films formed by coating the solution, which is prepared by dissolving said organic siloxane resins according to claim 1 in an organic solvent, onto a substrate.

6. Electronic devices comprising insulating films using organic siloxane resins manufactured by drying and hardening of insulating films formed by coating the solution, which is prepared by dissolving said organic siloxane resins according to claim 1 in an organic solvent, onto a substrate.

* * * * *